United States Patent
Machul et al.

(10) Patent No.: US 7,847,539 B2
(45) Date of Patent: Dec. 7, 2010

(54) INDUCTIVE PROXIMITY SENSOR

(75) Inventors: Olaf Machul, Freiburg (DE); Sascha Thoss, Duisburg (DE)

(73) Assignee: Sick AG, Waldkirch/Breisgau (DE)

( * ) Notice: Subject to any disclaimer, the term of this patent is extended or adjusted under 35 U.S.C. 154(b) by 451 days.

(21) Appl. No.: 12/029,648

(22) Filed: Feb. 12, 2008

(65) Prior Publication Data

US 2008/0197839 A1 Aug. 21, 2008

(30) Foreign Application Priority Data

Feb. 15, 2007 (DE) .................. 10 2007 007 551

(51) Int. Cl.
*G01B 7/14* (2006.01)
*G01R 35/00* (2006.01)
(52) U.S. Cl. .............. 324/207.15; 324/207.17; 324/202
(58) Field of Classification Search ................. 324/207.15–207.19, 202
See application file for complete search history.

(56) References Cited

U.S. PATENT DOCUMENTS 6,911,928 B2 6/2005 Orsier et al.
7,142,167 B2 11/2006 Rochelle et al.

FOREIGN PATENT DOCUMENTS

DE 10361013 A1 3/2005
EP 1382124 B1 8/2004
WO WO2007/068765 6/2007

OTHER PUBLICATIONS

Article: Junge, H.-D. & Möschwitzer, A., Lexikon Elektrotechnik. VCH Verlagsgesellschaft, Weinheim, 1999, pp. 122-123.
English Translation of Article: Junge, H.-D. & Möschwitzer, A., Lexikon Elektrotechnik. VCH Verlagsgesellschaft, Weinheim, 1999, pp. 122-123.
C. Azeredo Leme et al.; "Flexible Architecture for CMOS Sensor Interfaces"; Proceedings of the International Symposium on Circuits and Systems; 1992 IEEE; XP010061531A; pp. 1828-1831.
D. Weiler et al.; "Detection of Defective Sensor Elements Using ΣΔ-Modulation and a Matched Filter"; Fraunhofer Institute of Microelectronic Circuits and Systems (IMS); XP010377523A; pp. 599-603.
European Search Report Dated Aug. 8, 2008 Relating to European Patent Application No. 08 002 554.7, 3 pages.
P. Malcovati et al.; "Smart Sensor Interface with A/D Conversion and Programmable Calibration"; 8107 IEEE Journal of Solid-State Circuits 29(1994)August, No. 8.; XP000460922A; pp. 963-966.
Patrick Gaydecki et al.; "Design and evaluation of an inductive Q-detection sensor incorporating digital signal processing for imaging of steel reinforcing bars in concrete"; Measurement Science and Technology; XP0200663590; Published Jul. 18, 2002; pp. 1327-1335.
Translation of European Search Report Dated Aug. 8, 2008 Relating to European Patent Application No. 08 002 554.7, 4 pages.

*Primary Examiner*—Bot L LeDynh

(57) ABSTRACT

The invention relates to an inductive proximity sensor with a sensor element which includes a resonant circuit which provides an output signal which depends on the damping by an electrically conductive object. In accordance with the invention, the inductive proximity sensor has a ΣΔ modulator for the evaluation of an output signal of the resonant circuit. The invention furthermore relates to a method for the determination of the presence and/or of the spacing of a metallic object with the help of an inductive proximity sensor.

17 Claims, 3 Drawing Sheets

INDUCTIVE PROXIMITY SENSOR

Figure 1:
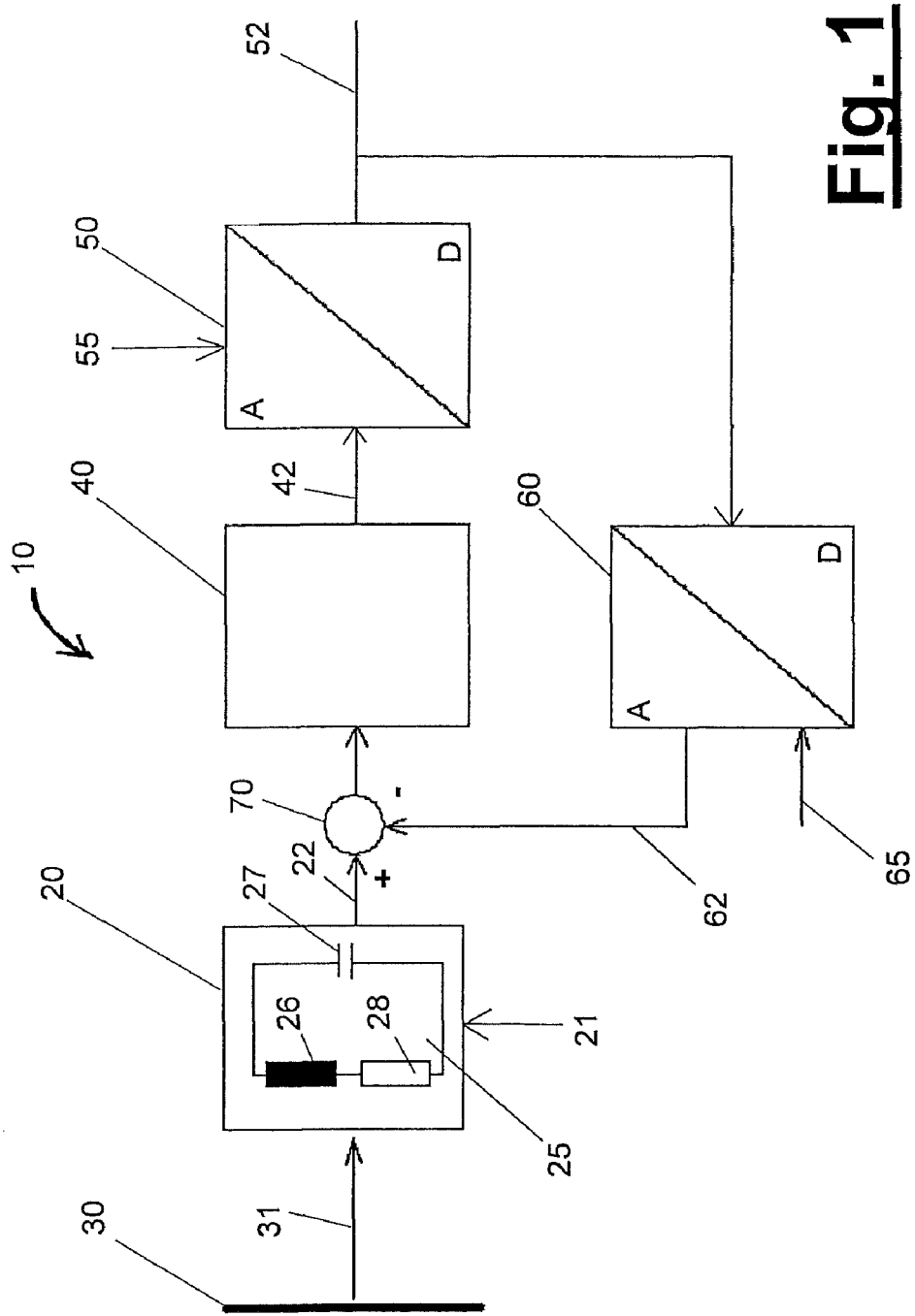

The invention relates to an inductive proximity sensor having a sensor element including a resonant circuit whose output signal depends on the damping by an electrically conductive object and to a method for the determination of the presence and/or of the spacing of an electrically conductive object.

Inductive proximity sensors detect electrically conductive metals on the basis of the eddy current principle. An alternating magnetic field which is radiated into space in a directed manner is built up by means of an electric resonant circuit from a coil and a capacitor (LC resonant circuit). If an electrically conductive object (also called a "target" in the following) moves into the range of the alternating field, eddy currents are induced in the target by the alternating field which in turn give rise to a magnetic field which is oppositely directed to the exciting magnetic field. The generation of the eddy currents removes energy from the exciting magnetic field and thus influences the impedance of the coil or damps the LC resonant circuit. An output signal of the LC resonant circuit, e.g. its oscillation amplitude, represents a measure for its damping which enables the detection of the metallic object. The object can, for example, be a switch cam which can trigger a switching signal via the proximity sensor.

Since the magnetic field reduces with the third power into space in the near area, it becomes more and more difficult to detect the target with sufficient precision as the spacing of the target from the coil increases. The spacing determined in accordance with IEC 60947-5-2/EN 60947-5-2 of a standard target from the inductive proximity switch at which a secure recognition of the target is ensured is called the rated operating distance and amounts to a few millimeters as a rule. In addition to a high temperature stability of the sensor, a reading out of the sensor signal with as high a resolution is possible contributes to achieving operating distances which are as large as possible and which go beyond the rated operating distance.

Usually, a change in the real part of the coil impedance or in the damping resistance is evaluated to detect the presence of a target. High-resolution signal techniques with a sufficiently large signal/noise distance are required to be able to detect a change in the real part of the coil impedance which turns out correspondingly lower with large operating distances, e.g. 3 times or 4 times the rated operating distance. The maximally possible physical resolution is limited by the noise of the LC resonant circuit.

A detection method customary and used often in the prior art comprises, for example, the rectifying of the output signal of the LC resonant circuit with a subsequent filtering and the concluding comparison of the filtered signal with a switching threshold via a comparator. With inductive proximity sensors which work in accordance with this principle, the quality of the rectification and of the comparator limits the achievable resolution. A considerable effort and/or cost is required in the production and alignment of the sensors to achieve high operating distances with such inductive proximity sensors.

It is the underlying object of the invention to make possible an inductive proximity switch with as high an operating distance as possible and a secure and robust operation, in particular to achieve a determination of an output signal of a resonant circuit which is as highly resolving as possible.

This object is satisfied by an inductive proximity switch having the features of claim 1. Preferred embodiments are the subject of dependent claims.

The inductive proximity sensor in accordance with the invention is characterized in that it uses a $\Sigma\Delta$ modulator (sigma delta modulator) for the evaluation of an output signal of the resonant circuit, in particular of an LC resonant circuit. The resonant circuit of the sensor element delivers an output signal which is influenced by a damping due to the presence of an electrically conductive target. This output signal is supplied to the input of the $\Sigma\Delta$ modulator and is guided from it through a filter, also called a loop filter in the following, to an A/D converter at whose output a pulse frequency modulated data stream is output. This data stream is fed back via a D/A converter.

The early conversion of the analog resonant circuit output into a digital signal contributes to the robustness of the inductive proximity switch in accordance with the invention with respect to external electromagnetic interference influences. The generated pulse frequency modulated data stream at the output of the A/D converter contains information on the damping resistance of the resonant circuit in digital, highly linear and highly resolved form. The high resolution is facilitated due to the noise shaping property of the $\Sigma\Delta$ modulator, by which interference influences (e.g. white noise) can be largely suppressed. The precision which can thus be achieved and the presence of the information in digital form enable a use of the inductive proximity switch not only for the generation of switch signals (binary sensor), but also for the precise measurement of the spacing between the object and the proximity sensor (analog sensor). The concept of the inductive proximity sensor in accordance with the invention can thus be used for the setup of both binary proximity sensors and analog inductive proximity sensors.

In accordance with particularly preferred embodiments of the inductivity sensor in accordance with the invention, the resonant circuit is provided in the feedback loop of the $\Sigma\Delta$ modulator so that it becomes a component of a control circuit. In this connection, the amount of energy is supplied to the resonant circuit by means of signal feedback via the D/A converter which is removed from it by eddy currents induced in a target. This can be achieved by a feeding in of the fed back signal synchronized with the resonant cycle of the resonant circuit, with a particularly simple aspect providing for the fed back signal to be rectangular.

The feedback in a control circuit arrangement has the result that an output signal of the resonant circuit, preferably the oscillation amplitude, can be controlled to a preset desired value. Such an embodiment with integration of the resonant circuit into a control circuit allows a large dynamic range of the inductive proximity sensor with respect to the damping of the resonant circuit because even large damping variations cannot cause any negative effects such as resonance break-up.

A further preferred embodiment of the inductive proximity sensor in accordance with the invention provides for the use of a $\Sigma\Delta$ higher order modulator. The achievable resolution of the inductive proximity sensor can thereby be further increased.

Different filter types can be provided for the loop filter, with a low pass filter, an integrator in the simplest case, being preferred. In this case, the control parameter is preferably determined by peak value sampling. When a loop filter with band pass characteristics is used, which is just as possible as a loop filter with high pass characteristics, the control parameter is preferably determined by a digital mixing process. The loop filter can be a first order filter or a higher order filter.

A further filter can in particular be provided on the use of an inductive proximity sensor with a higher order $\Sigma\Delta$ modulator, said further filter preferably being arranged between the sensor element and the loop filter and serving for the phase correction.

The mentioned filters can be set up continuously or discretely, with a discrete embodiment being less sensitive to noise as a rule.

The quantization of the A/D converters provided and the word width of the D/A converters provided can generally be freely selectable, but preferably amounts in each case to 1 bit, which simplifies the setup and can increase the conversion speed.

The use of A/D converters and D/A converters with voltage based and/or current based inputs or outputs is possible and can therefore advantageously be selected in dependence on the application.

The object is furthermore satisfied by a method having the features of claim 16. The advantages of the method in accordance with the invention and particularly preferred aspects result in an analog manner from the above explanations on corresponding embodiments of the apparatus in accordance with the invention and its advantages.

Figure 2:
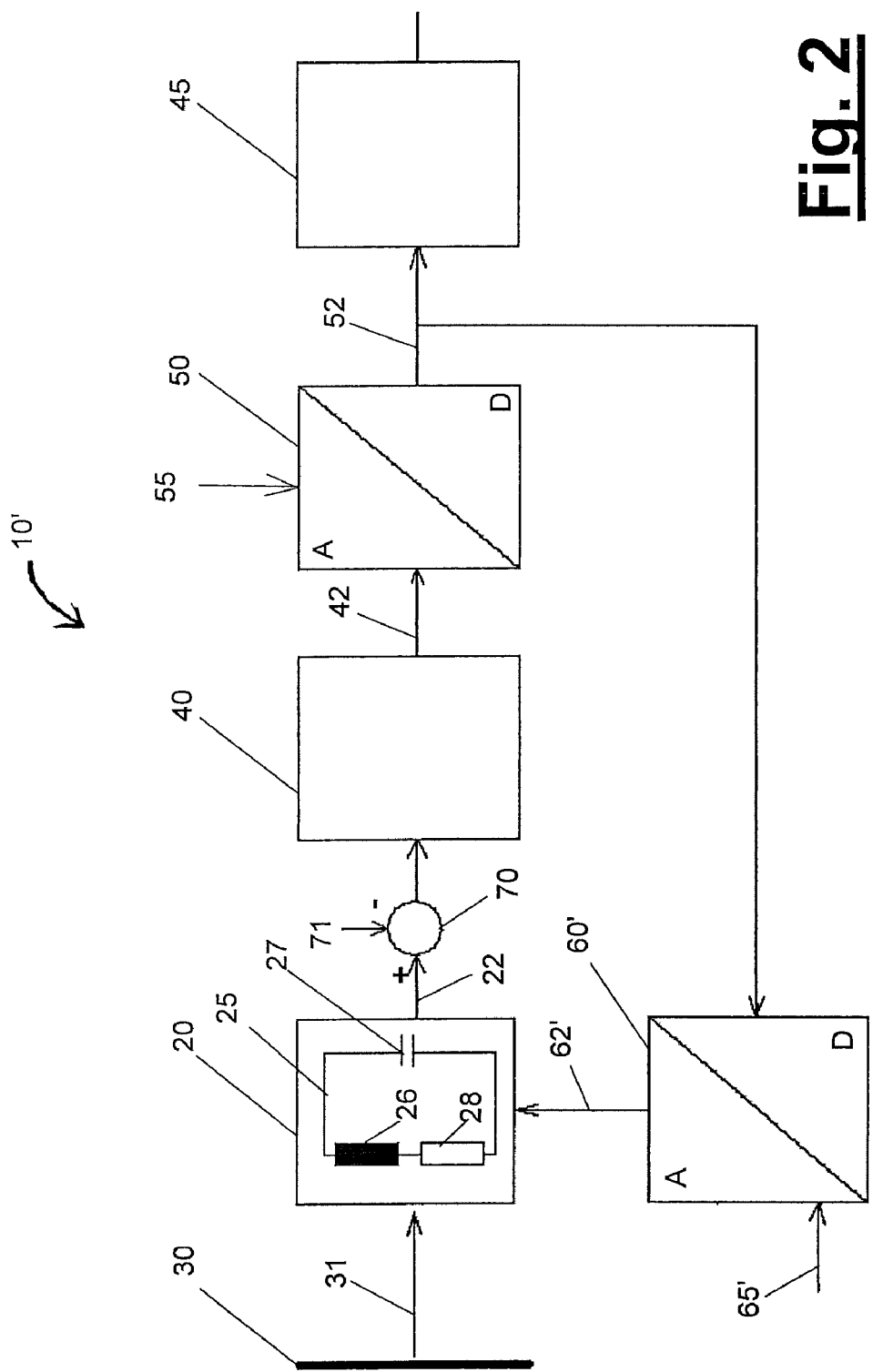
Figure 3:
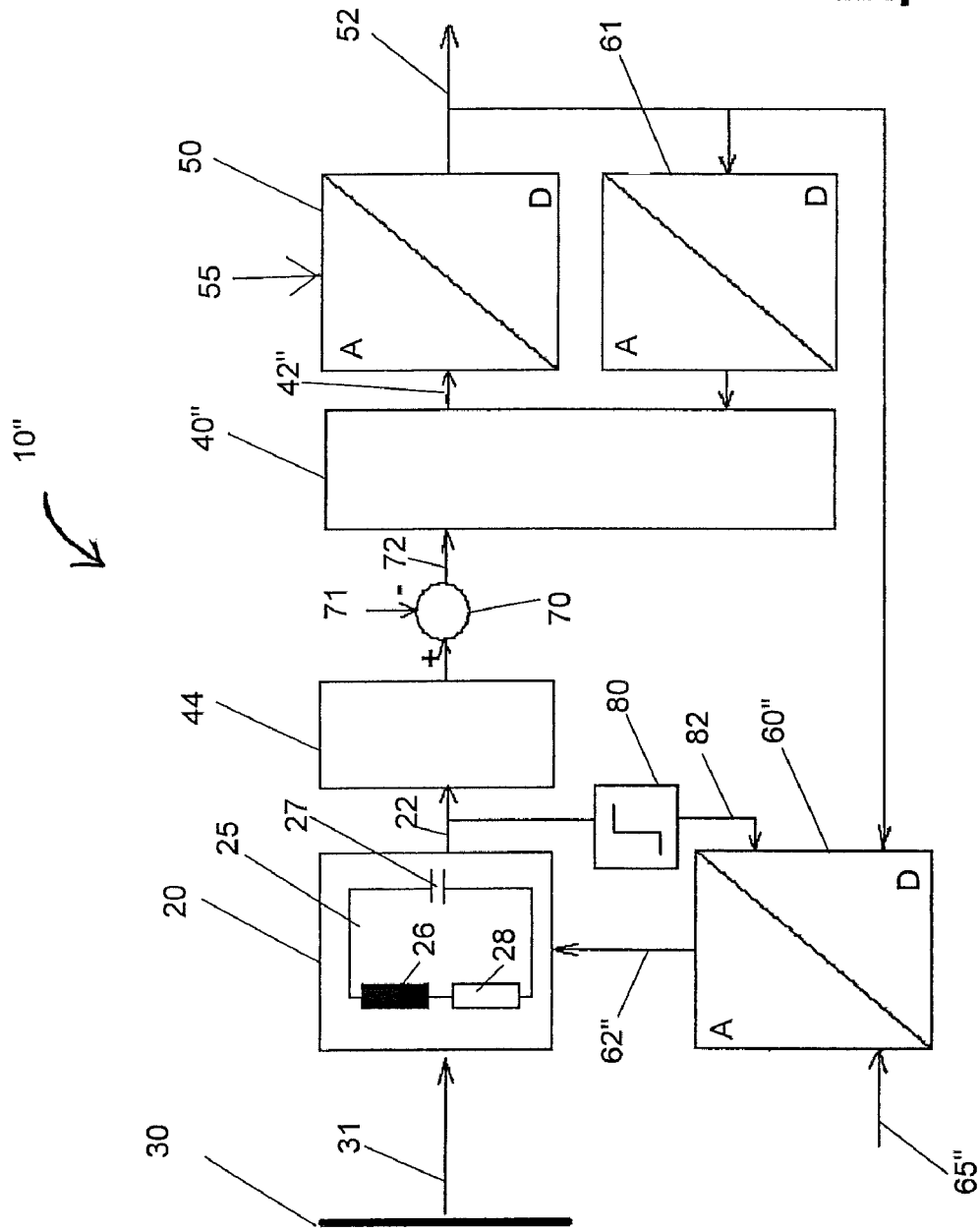

The invention will be explained in detail in the following with reference to exemplary embodiments and to the enclosed schematic Figures. There are shown:

FIG. 1 a block diagram of an embodiment of the inductive proximity sensor in accordance with the invention with a $\Sigma\Delta$ modulator;

FIG. 2 a block diagram of an embodiment of the inductive proximity sensor in accordance with the invention with the LC resonant circuit in the feedback circuit of the $\Sigma\Delta$ modulator; and FIG. 3 a block diagram of an embodiment of the inductive proximity sensor in accordance with the invention on the basis of a higher order $\Sigma\Delta$ modulator.

A block diagram of an inductive proximity sensor 10 in accordance with the invention is shown in FIG. 1. It includes a sensor element 20 and a $\Sigma\Delta$ modulator with a loop filter 40, which is made as an integrator in the simplest case, an A/D converter 50, a D/A converter 60 and a summation point 70.

The sensor element 20 includes an LC resonant circuit 25 with a coil 26, a capacitor 27 and a resistor 28 which should illustrate coil losses. An input 21 of the sensor element 20 serves for the energy supply of the sensor element with electrical energy which, in a manner known per se, is fed in for the maintenance of the resonance in the LC resonant circuit. The output signal 22, for example, corresponds to the voltage shape in the LC resonant circuit. If the spacing 31 between the sensor element 20 and an object 30 in the range of the alternating magnetic field of the coil 26 varies, the damping changes and thus the voltage amplitude of the LC resonant circuit. The output signal 22 is evaluated with the help of a $\Sigma\Delta$ modulator as follows:

The current output value 62 of the D/A converter 60 is deducted from the output signal 22 at the summation point 70. The resulting difference runs through the loop filter 40 in which it is substantially integrated and is subsequently converted by the A/D converter 50 into a digital, pulse frequency modulated data stream 52. The A/D converter 50 in the preferred embodiment is a simple comparator or 1 bit A/D converter which only has the two states "low" and "high". If the integrated output signal 42 of the loop filter 40 is larger than zero, the output 52 is switched to "high", for example; otherwise to "low".

The A/D converter 50 works at a sampling rate 55 which is selected in a manner known per se to be higher by a multiple than required by the sampling theory so that the output signal 42 of the loop filter and thus the output signal of the LC resonant circuit is oversampled.

The pulse frequency modulated data stream 52 is converted into an analog signal 62 by the D/A converter 60, which has a word width of 1 bit in the preferred embodiment, and is fed back to the summation point 70.

A voltage reference value 65 with which the voltage level of the D/A converter output signal 62 is set is made available to the D/A converter 60 in the embodiment shown in FIG. 1.

A conclusion can be drawn on the oscillation amplitude of the output signal 22 of the LC resonant circuit 25 from the pulse frequency in the data stream 52. A statement is thus obtained on the damping of the LC resonant circuit 25 which is caused by the present of an object 30. An evaluation of the data stream 52 thus enables the determination whether a metallic object 30 is present and—with a corresponding resolution—the spacing 31 at which it is located.

The block diagram of FIG. 2 shows a preferred embodiment of an inductive proximity sensor 10' in accordance with the invention with a sensor element 20, a loop filter 40, an A/D converter 50, a D/A converter 60', a summation point 70 and a decimation filter 45.

In this embodiment, the sensor element 20 is directly integrated into the feedback loop of the $\Sigma\Delta$ modulator. A preset desired value 71, here a constantly selected desired value, is deducted from the output signal 22 of the sensor element 20 at the summation point 70. The resulting difference is guided through the integrating loop filter 40 to the A/D converter 50 which works, as described, with the working cycle 55. The digital values output by the A/D converter form a pulse frequency modulated data stream 52 at the input of a decimation filter 45. The latter serves in a manner known per se for the thinning out of redundant information of the pulse frequency modulated data stream 52 which arises through oversampling in $\Sigma\Delta$ modulators.

The data stream 52 is fed back via the D/A converter 60' and is fed into the sensor element 20 as an analog current signal 62' synchronized such that the energy amount required by the LC resonant circuit 25 is always delivered to maintain the output signal 22 of the LC resonant circuit 25 at the preset desired value 71. For reasons of simplicity, this feeding is done in rectangular form. A current reference value 65' is made available to the D/A converter 60' for the fixing of the level of the fed in current signal 62'.

Within the framework of the explanation of the embodiment of FIG. 3, an implementation possibility for the provision of the required energy amount is shown.

It is achieved by the integration of the LC resonant circuit into the feedback loop of the $\Sigma\Delta$ modulator that the output signal 22 of the LC resonant circuit 25 is substantially always controlled to the preset desired value 71, even if the damping of the resonant circuit 25 is changed by an object 30. Higher dynamics of the inductive proximity sensor 10' is thereby made possible because interference, e.g. due to resonance break-off, is avoided.

The block diagram of an inductive proximity sensor 10" in accordance with the invention based on a higher order $\Sigma\Delta$ modulator shown in FIG. 3 shows a further preferred embodiment with a sensor element 20, a phase correction filter 44, a summation point 70, a loop filter 40", an A/D converter 50, D/A converters 60" and 61 and a comparator 80.

The sensor element 20 also receives the energy required to guide the output signal 22 of the LC resonant circuit 25 in accordance with the setting by the desired value 71 from the output of the D/A converter 60" in the form of a current signal 62" in this embodiment. The output 22 of the sensor element 20 controls a comparator 80 which in turn acts via an output 82 on the D/A converter 60" such that it only converts the applied input value 52 into an analog value and emits it at its output 62" when the comparator output 82 has a corresponding value. In this context, the comparator 80 switches its output 82 e.g. to "high" when the output signal 22 of the LC resonant circuit 25 is above a preset threshold. Otherwise, the comparator 80 switches to "low".

The output 22 of the sensor element 20 runs through the optional phase correction filter 44 which counteracts in a manner known per se the increased phase rotation caused by the higher order modules and thus essentially serves for the stabilization of the higher order ΣΔ modulator. The desired value 71 is deducted at the summation point 70 to form the difference signal 72.

The loop filter 40" is a higher order filter in this embodiment through which the difference signal 72 is guided. The output 42" is guided to the A/D converter 50 which works with the working cycle 55, whereby a pulse frequency modulated data stream 52 arises in the described manner. It is, on the one hand, guided back to the loop filter 40" via the D/A converter 61 and, on the other hand, as with a single-stage ΣΔ modulator, to the D/A converter 60" whose current output signal 62" is fed in the manner described into the LC resonant circuit 25.

The advantage of the architecture of the higher order ΣΔ modulator used in this embodiment is substantially a further increase of the resolution of the pulse frequency modulated data stream 52 which is achievable therewith.

The discussed exemplary embodiments can be implemented or combined in different variations. It is thus possible, for example, to design the loop filters 40, 40" and the phase correction filter 44 as discrete filters or as continuous filters. Furthermore, a low pass is preferably used as the filter characteristics for the loop filters 40 and 40", but both a band pass and a high pass are possible.

It is also possible to set the quantization of the A/D converter 50 and the word width of the D/A converters 60, 60', 60" and 61 to values different from 1 bit, although 1 bit is preferred for reasons of simplicity of setup.

Finally, it is possible to set up the inputs and the outputs of the D/A converters 60, 60', 60" and 61 in each case as current based or voltage based. The embodiment of FIGS. 2 and 3 was thus e.g. described such that a current value is applied to the respective reference input 65', 65" of the D/A converter 60', 60" and the respective output 62', 62" is likewise a current value whereas the input of the D/A converter 60', 60" is voltage based. In the embodiment of FIG. 1, all inputs and outputs are described as voltage based. Other combinations are, however, likewise possible with a corresponding embodiment.

REFERENCE NUMERAL LIST 10, 10', 10" inductive proximity sensor
20 sensor element
21 input of the sensor element
22 output of the sensor element
25 LC resonant circuit
26 coil
27 capacitor
28 resistor
30 target, object
31 spacing between object and sensor element
40, 40" loop filter
42, 42" loop filter output
44 phase correction filter
45 decimation filter
50 A/D converter (analog/digital converter)
52 pulse frequency modulated data stream
55 sampling rate
60, 60', 60" D/A converter (digital/analog converter)
61 D/A converter (digital/analog converter)
62, 62', 62" D/A converter output
65, 65', 65" reference value for D/A converter
70 summation point
71 desired value
72 difference signal
80 comparator
82 comparator output

The invention claimed is:

1. An inductive proximity sensor for a determination of at least one of (i) a presence of an electrically conductive object and (ii) a spacing of the electrically conductive object, comprising:
a sensor element, which includes a resonant circuit, which provides an output signal which depends on damping by an electrically conductive object; and
a ΣΔ modulator for an evaluation of an output signal of the resonant circuit, with the ΣΔ modulator having a feedback loop, which includes
at least one loop filter, and
at least one A/D converter and at least one D/A converter.

2. An inductive proximity switch in accordance with claim 1, characterized in that the resonant circuit (25) is provided in the feedback loop of the ΣΔ modulator.

3. An inductive proximity switch in accordance with claim 2, characterized in that the output signal (22), preferably its oscillation amplitude, of the resonant circuit (25) is controlled to a preset desired value (71) in the feedback circuit of the ΣΔ modulator.

4. An inductive proximity sensor in accordance with claim 2, characterized in that the feedback loop of the ΣΔ modulator is designed to make available a signal (62', 62") which is fed into the resonant circuit (25) of the sensor element (20) for the compensation of a damping caused by the presence of a metallic object (30).

5. An inductive proximity switch in accordance with claim 4, characterized in that the feed of the signal (62', 62") takes place synchronized with the resonant cycle of the resonant circuit (25).

6. An inductive proximity switch in accordance with claim 5, characterized in that the fed in signal (62', 62") is rectangular.

7. The inductive proximity sensor in accordance with claim 1, wherein the ΣΔ modulator is a higher order ΣΔ modulator.

8. The inductive proximity sensor in accordance with claim 1, wherein the loop filter of the ΣΔ modulator has a low pass characteristic.

9. The inductive proximity sensor in accordance with claim 1, wherein the loop filter of the ΣΔ modulator has a band pass characteristic.

10. The inductive proximity sensor in accordance with claim 1, wherein the loop filter includes a higher order filter.

11. The inductive proximity sensor in accordance with claim 1, wherein a phase correction filter is provided in the feedback loop of the ΣΔ modulator.

12. The inductive proximity sensor in accordance with claim 11, wherein the phase correction filter is made as a discrete phase correction filter.

13. The inductive proximity sensor in accordance with claim 1, wherein the loop filter is made as a discrete loop filter.

14. The inductive proximity sensor in accordance with claim 1, wherein at least one of (i) a quantization of the at least one A/D converter amounts to 1 bit and (ii) a word width of the at least one D/A converter amounts to 1 bit.

15. The inductive proximity sensor in accordance with claim 1, wherein the output of the at least one D/A converter is current based.

16. The inductive proximity sensor in accordance with claim 1, wherein the resonant circuit is an LC resonant circuit.

17. The inductive proximity sensor in accordance with claim 11, wherein the phase correction filter is provided in the feedback loop of the ΣΔ modulator between the sensor element and the loop filter.

* * * * *

UNITED STATES PATENT AND TRADEMARK OFFICE
CERTIFICATE OF CORRECTION

| | |
|---|---|
| PATENT NO. | : 7,847,539 B2 |
| APPLICATION NO. | : 12/029648 |
| DATED | : December 7, 2010 |
| INVENTOR(S) | : Machul et al. |

It is certified that error appears in the above-identified patent and that said Letters Patent is hereby corrected as shown below:

| | |
|---|---|
| Column 1, Line 35 | Delete "is" and insert --as--. |
| Column 4, Line 40 | Delete "fed" and insert --feed--. |

Signed and Sealed this
First Day of March, 2011

David J. Kappos
*Director of the United States Patent and Trademark Office*